(12) United States Patent
Matsumoto

(10) Patent No.: US 11,428,673 B2
(45) Date of Patent: *Aug. 30, 2022

(54) ULTRASONIC INSPECTION DEVICE

(71) Applicant: HAMAMATSU PHOTONICS K.K., Hamamatsu (JP)

(72) Inventor: Toru Matsumoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 716 days.

This patent is subject to a terminal disclaimer.

(21) Appl. No.: 16/346,585

(22) PCT Filed: Sep. 8, 2017

(86) PCT No.: PCT/JP2017/032545
§ 371 (c)(1),
(2) Date: May 1, 2019

(87) PCT Pub. No.: WO2018/083882
PCT Pub. Date: May 11, 2018

(65) Prior Publication Data
US 2019/0257798 A1 Aug. 22, 2019

(30) Foreign Application Priority Data

Nov. 4, 2016 (JP) .............................. JP2016-216025

(51) Int. Cl.
*G01N 29/28* (2006.01)
*G01R 31/26* (2020.01)
(Continued)

(52) U.S. Cl.
CPC ........... *G01N 29/265* (2013.01); *G01N 29/11* (2013.01); *G01N 29/225* (2013.01); *G01N 29/27* (2013.01);
(Continued)

(58) Field of Classification Search
CPC ...... G01R 31/26; G01R 31/28; G01R 31/317; G01R 31/2601; G06T 7/0004;
(Continued)

(56) References Cited

U.S. PATENT DOCUMENTS 5,493,912 A 2/1996 Gunther et al.
6,072,327 A 6/2000 Nikawa
(Continued)

FOREIGN PATENT DOCUMENTS

CN 101156065 A 4/2008
CN 102928516 A 2/2013
(Continued)

OTHER PUBLICATIONS

International Preliminary Report on Patentability dated May 16, 2019 for PCT/JP2017/032545.

*Primary Examiner* — Jacques M Saint Surin
(74) *Attorney, Agent, or Firm* — Faegre Drinker Biddle & Reath LLP

(57) ABSTRACT

Provided is an ultrasonic inspection device for inspecting a packaged semiconductor device, The ultrasonic inspection device including an ultrasonic transducer that is disposed to face the semiconductor device; a medium holding unit that is provided at an end of the ultrasonic transducer facing the semiconductor device and holds a medium through which ultrasonic waves are propagated; a stage that moves the position of the semiconductor device relative to the ultrasonic transducer; and an analysis unit that analyzes the reaction of the semiconductor device in accordance with input of the ultrasonic waves from the ultrasonic transducer.

9 Claims, 10 Drawing Sheets

(51) Int. Cl.
*G01R 31/317* (2006.01)
*G06T 7/00* (2017.01)
*G01R 31/28* (2006.01)
*G01N 29/27* (2006.01)
*G01N 29/22* (2006.01)
*G01N 29/11* (2006.01)
*G01N 29/265* (2006.01)

(52) U.S. Cl.
CPC ............. *G01N 29/28* (2013.01); *G01R 31/26* (2013.01); *G01R 31/2601* (2013.01); *G01R 31/28* (2013.01); *G01R 31/317* (2013.01); *G06T 7/0004* (2013.01); *G01N 2291/015* (2013.01); *G01N 2291/0258* (2013.01); *G01N 2291/2697* (2013.01); *G06T 2207/30148* (2013.01)

(58) Field of Classification Search
CPC .......... G06T 2207/30148; G01N 29/28; G01N 29/27; G01N 29/11; G01N 29/225; G01N 29/265; G01N 2291/2697; G01N 2291/015; G01N 2291/0258
USPC .......................................................... 73/644
See application file for complete search history.

(56) References Cited

U.S. PATENT DOCUMENTS

| | | | |
|---|---|---|---|
| 7,518,251 B2 * | 4/2009 | Fisher | ................... H01L 23/481 438/455 |
| 9,121,817 B1 | 9/2015 | Roach et al. | |
| 10,302,600 B2 * | 5/2019 | Palmer | ................. G01N 29/221 |
| 10,955,458 B2 * | 3/2021 | Matsumoto | .......... G01R 31/302 |
| 11,105,777 B2 * | 8/2021 | Matsumoto | .......... G01N 29/225 |

FOREIGN PATENT DOCUMENTS

| | | |
|---|---|---|
| CN | 105934668 A | 9/2016 |
| JP | H03-29848 A | 2/1991 |
| JP | H8-320259 A | 12/1996 |
| JP | H08-320359 A | 12/1996 |
| JP | 2003-254953 A | 9/2003 |
| JP | 2004-077341 A | 3/2004 |
| JP | 2011-53126 A | 3/2011 |
| JP | 2013-178101 A | 9/2013 |
| KR | 2005-0055040 A | 6/2005 |
| WO | WO-2015/099229 A1 | 7/2015 |

* cited by examiner

ULTRASONIC INSPECTION DEVICE

TECHNICAL FIELD

The present invention relates to an ultrasonic inspection device.

BACKGROUND ART

As a conventional ultrasonic inspection device, there is an inspection device for a semiconductor integrated circuit wiring system using ultrasonic heating described in Patent Document 1, for example. In this conventional ultrasonic inspection device, ultrasonic waves are radiated to a semiconductor integrated circuit which is an object to be inspected while electric power is supplied from a constant voltage source. Additionally, a current image or a defect image of the semiconductor integrated circuit is generated by detecting change in a current flowing through a ground wiring due to irradiation with the ultrasonic waves.

CITATION LIST

Patent Literature

[Patent Literature 1] Japanese Unexamined Patent Publication No. H8-320359

SUMMARY OF INVENTION

Technical Problem

In the above-described conventional ultrasonic inspection device, a semiconductor chip taken out from a package may be an object to be inspected. However, considering the necessity of taking out the semiconductor chip from the package and the possibility of the characteristics of a circuit changing at the time of taking out the semiconductor chip, it is preferable to inspect the semiconductor device in a packaged state. On the other hand, when a packaged semiconductor device is inspected, since the semiconductor chip which is at an observation point may not be able to be visually recognized from the outside, devices for allowing the ultrasonic waves to be focused easily on the semiconductor chip may be required.

The present invention has been realized in order to solve the above-described problem, and an object thereof is to provide an ultrasonic inspection device in which a focal point of ultrasonic waves is easily able to be adjusted such that it has a desired position on a packaged semiconductor device.

Solution to Problem

An ultrasonic inspection device according to one aspect of the present invention is an ultrasonic inspection device for inspection of a packaged semiconductor device, including an ultrasonic transducer disposed to face the semiconductor device, a medium holding unit configured to be provided at an end of the ultrasonic transducer facing the semiconductor device and hold a medium through which ultrasonic waves are propagated, a stage configured to move a position of the semiconductor device relative to the ultrasonic transducer, and an analysis unit configured to analyze a reaction of the semiconductor device in accordance with an input of the ultrasonic waves from the ultrasonic transducer.

In this ultrasonic inspection device, an interval between the ultrasonic transducer and the semiconductor device can be adjusted in accordance with a position of the medium holding unit provided at the end of the ultrasonic transducer in a state in which the medium for propagating the ultrasonic waves is held between the ultrasonic transducer and the semiconductor device. Therefore, a focal point of the ultrasonic waves can be easily adjusted to a desired position in the packaged semiconductor device.

Further, the medium holding unit may be configured by a tubular member provided at the end of the ultrasonic transducer. In this case, a holding space for the medium can be formed between an inside of the tubular member and the end of the ultrasonic transducer.

Further, the medium holding unit may be slidably fitted to the end of the ultrasonic transducer. In this case, the interval between the ultrasonic transducer and the semiconductor device can be easily adjusted by adjusting a fitting position of the tubular member at the end of the ultrasonic transducer.

Further, the medium holding unit may have a medium flow port configured to adjust a holding amount of the medium. Accordingly, it is easy to control the holding amount of the medium held by the medium holding unit.

Further, the medium holding unit may have a holding amount detection unit configured to detect a holding amount of the medium. Accordingly, it is easier to control the holding amount of the medium held by the medium holding unit.

Further, the ultrasonic inspection device may further include a power supply device configured to apply a constant voltage or a constant current to the semiconductor device, and a reaction detection unit configured to detect a current or a voltage of the semiconductor device in accordance with input of the ultrasonic waves in a state in which the constant voltage or the constant current is applied, and the analysis unit may generate an analysis image on the basis of a detection signal from the reaction detection unit. In this case, the inspection of the packaged semiconductor device can be performed with high accuracy by measuring change in resistance in the semiconductor device caused by the input of the ultrasonic waves.

Further, the ultrasonic inspection device may further include a signal generation unit configured to input a driving signal to the ultrasonic transducer and output a reference signal corresponding to the driving signal, and the analysis unit may generate the analysis image on the basis of the detection signal and the reference signal. Thus, it is possible to further improve inspection accuracy of the packaged semiconductor device.

Further, the ultrasonic inspection device may further include a reflection detection unit configured to detect reflected waves of the ultrasonic waves reflected by the semiconductor device, and the analysis unit may generate a reflection image on the basis of a detection signal from the reflection detection unit. Thus, a shape of a chip inside the semiconductor device can be acquired on the basis of the reflection image.

Further, the analysis unit may generate a superimposed image in which the analysis image and the reflection image are superimposed. In this case, since an analysis result based on the analysis image and the shape of the chip inside the semiconductor device are superimposed, it is easy to identify a position of a fault and the like.

Advantageous Effects of Invention

According to the present invention, it is possible to easily adjust a focal point of ultrasonic waves to a desired position in a packaged semiconductor device.

DESCRIPTION OF EMBODIMENTS

Hereinafter, a preferred embodiment of an ultrasonic inspection device according to one aspect of the present invention will be described in detail with reference to the drawings.

Figure 1:
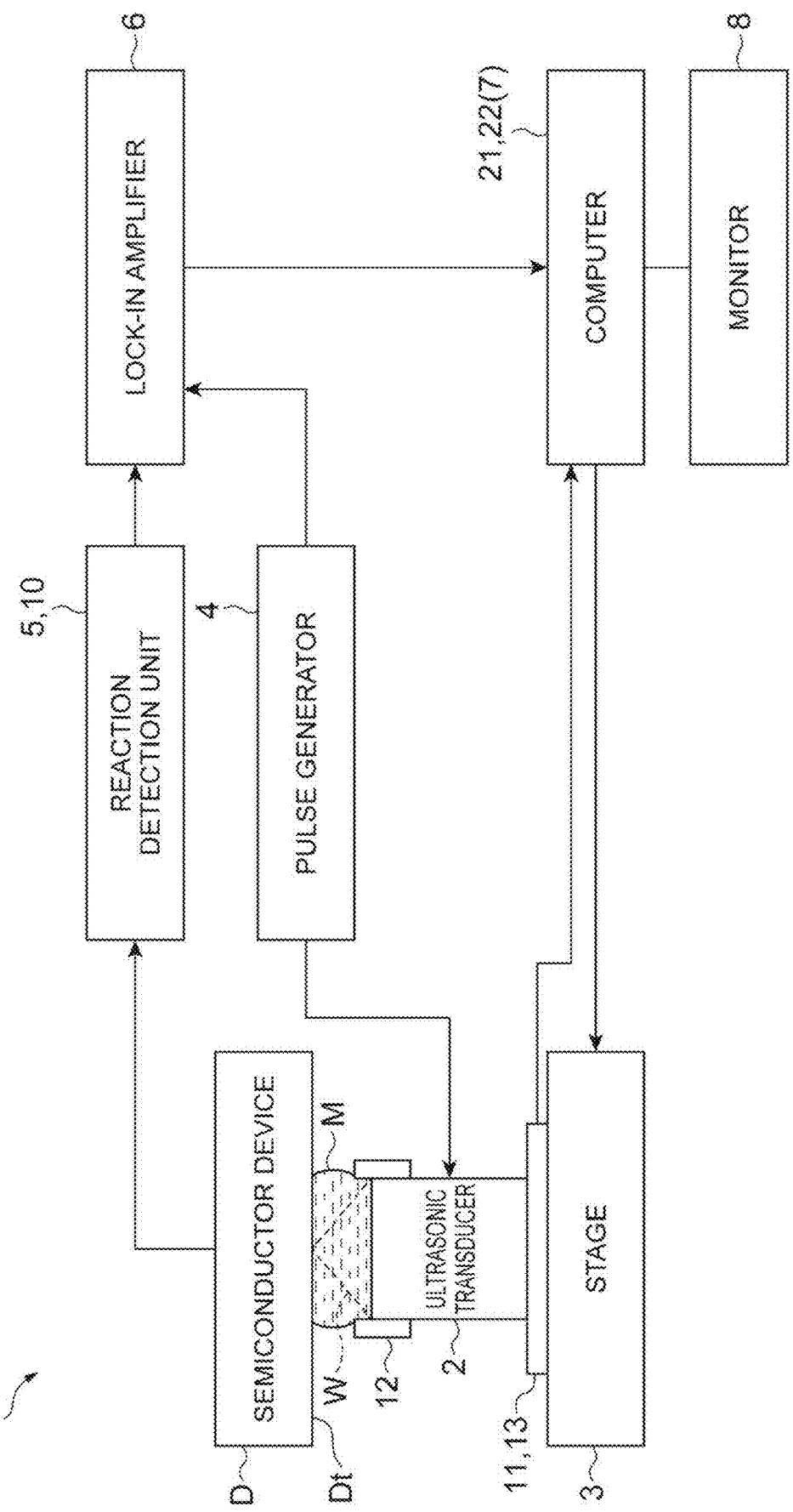
FIG. 1 is a schematic configuration diagram showing an embodiment of an ultrasonic inspection device.

FIG. 1 is a schematic configuration diagram showing an embodiment of an ultrasonic inspection device. The ultrasonic inspection device 1 is a device for inspecting a semiconductor device D as an object to be inspected while keeping the semiconductor device D in a packaged state. The ultrasonic inspection device 1 is configured as a device for determining the presence or absence of faults in the packaged semiconductor device D and identifying a position of a fault on the basis of a method of measuring change in resistance in the semiconductor device D caused by an input of ultrasonic waves W.

One surface side of the semiconductor device D is an inspection surface Dt to which the ultrasonic waves W are input. The semiconductor device D is held by a holding plate or the like in a state in which the inspection surface Dt faces downward. The semiconductor device D may be a separate semiconductor element (discrete) including diodes, power transistors or the like, an optoelectronic element, a logic large scale integration (LSI) constituted by a sensor/an actuator or a transistor having a metal-oxide-semiconductor (MOS) structure or a bipolar structure, a memory element, a linear integrated circuit (IC), a hybrid device thereof, and the like. Further, the semiconductor device D may be a package including a semiconductor device, a composite substrate, or the like.

As shown in FIG. 1, the ultrasonic inspection device 1 includes an ultrasonic transducer 2, a stage 3, a pulse generator (a signal generation unit) 4, a reaction detection unit 5, a lock-in amplifier (a frequency analysis unit) 6, a computer (an analysis unit) 7, and a monitor 8.

Figure 2:
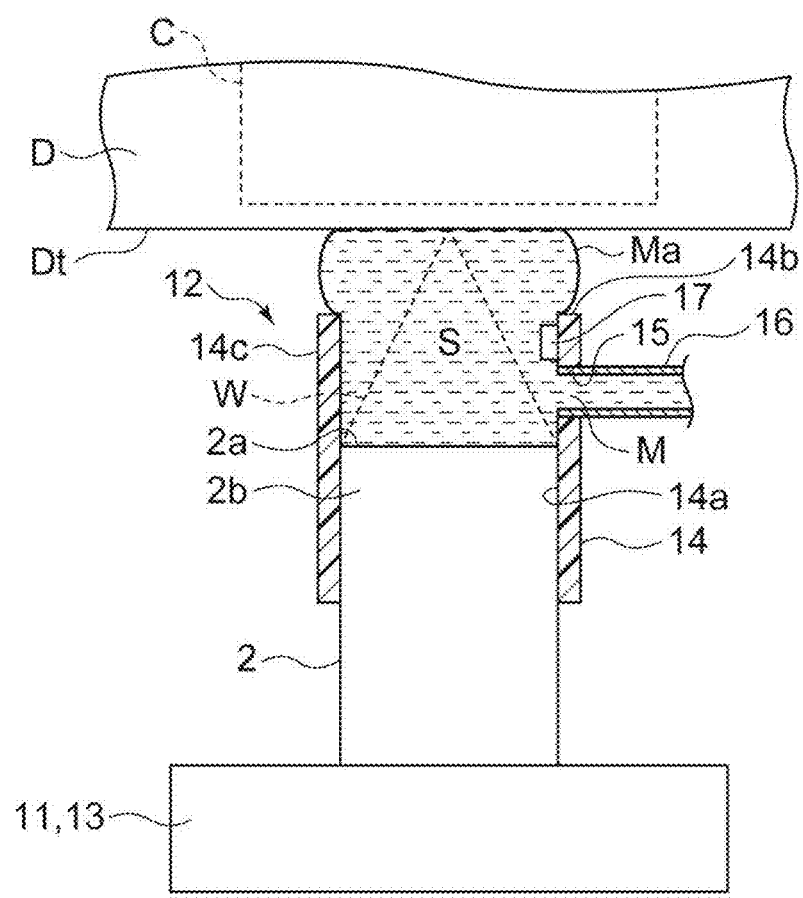
FIG. 2 is a schematic diagram showing a configuration of an ultrasonic transducer.

The ultrasonic transducer 2 is a device which inputs the ultrasonic waves W to the semiconductor device D. As shown in FIG. 2, the ultrasonic transducer 2 has a pulser 11 and a medium holding unit 12. The ultrasonic transducer 2 has, for example, a tubular shape, more specifically, a cylindrical shape. A tip end surface 2a of the ultrasonic transducer 2 is a portion which outputs the ultrasonic waves W and is disposed upward to face an inspection surface Dt of the semiconductor device D. The tip end surface 2a actually has a concave shape, and the ultrasonic waves W generated at respective positions on the tip end surface 2a have a focal point at a position a predetermined distance away from the tip end surface 2a. The ultrasonic waves W output from the tip end surface 2a are elastic vibration waves of about 20 kHz to 10 GHz, for example.

The pulser 11 is a unit which drives the ultrasonic transducer 2 on the basis of a driving signal output from the pulse generator 4. In the embodiment, the pulser 11 also has a function as a receiver (a reflection detection unit) 13 which detects the ultrasonic waves W reflected by the inspection surface of the semiconductor device D. The receiver 13 detects the reflected waves of the ultrasonic waves W and outputs a detection signal indicating a detection result to the computer 7.

The medium holding unit 12 is a unit which holds a medium M between the ultrasonic transducer 2 and the semiconductor device D. The medium M held by the medium holding unit 12 is water in the embodiment. The medium M is not particularly limited as long as it matches an impedance of a material used for a package of the semiconductor device D, and another liquid such as glycerin, a gel-like or jelly-like substance, or the like may be used as the medium M. In the embodiment, the medium holding unit 12 has a tubular member 14 forming of a material having sufficient flexibility and wettability with respect to the medium M, such as a silicone resin. The tubular member 14 is detachably fitted to an end 2b of the ultrasonic transducer 2 on the side of the tip end surface 2a.

When the tubular member 14 is slidably fitted to the end 2b so that a part of the tubular member 14 protrudes from the tip end surface 2a, a holding space S for holding the medium M is formed by an inner peripheral surface 14a of the tubular member 14 and the tip end surface 2a of the ultrasonic transducer 2. A volume of the holding space S can be varied by adjusting a protrusion amount of the tubular member 14 from the tip end surface 2a of the ultrasonic transducer 2. It is possible to adjust a range over which the focal position of the ultrasonic waves W output from the ultrasonic transducer 2 can be adjusted by adjusting the protrusion amount of the tubular member 14. Accordingly, it is possible to provide an optimum volume for the holding space S at which the medium M does not spill out even for semiconductor devices D having packages with different resin thicknesses.

Graduation markings are provided on the tubular member 14 to facilitate ascertaining of the protrusion amount of the tubular member 14. A position at which the Graduation markings are provided is, for example, an inner peripheral surface 14a or an outer peripheral surface 14c of the tubular member 14. The protrusion amount of the tubular member 14 can be adjusted by manually sliding a position of the tubular member 14 with respect to the end 2b of the ultrasonic transducer 2 and changing a fitting amount of the tubular member 14. The position of the tubular member 14 with respect to the end 2b of the ultrasonic transducer 2 may be adjusted using a slide mechanism. Further, the protrusion amount of the tubular member 14 may be adjusted by replacing the tubular member 14 with a tubular member 14 having a different length, while keeping the fitting amount of the tubular member 14 constant.

A medium flow port 15 for adjusting a holding amount of the medium M held in the holding space S is provided in a peripheral wall portion of the tubular member 14. A flow pipe 16 connected to an external medium storage unit (not shown) is inserted into the medium flow port 15 so that an inflow of the medium M into the holding space S and a discharge of the medium M from the holding space S may be performed. A flow rate of the medium M is controlled by the computer 7, for example.

It is preferable that the medium flow port 15 be provided at a certain distance from a tip end surface 14b of the tubular member 14. Thereby, it is possible to prevent foreign matter accumulating in the vicinity of the tip end surface 14b of the tubular member 14 in the holding space S even when foreign matter is mixed into the medium M flowing in from the medium flow port 15. The ultrasonic waves W are focused on the vicinity of the tip end surface 14b of the tubular member 14, rather than the vicinity of the tip end surface 2a of the ultrasonic transducer 2. Therefore, accumulation of foreign matter in the vicinity of the tip end surface 14b of the tubular member 14 is minimized, and an influence of interference of the ultrasonic waves W due to foreign matter can be minimized.

Further, a level sensor (a holding amount detection unit) 17 for detecting the holding amount of the medium M in the holding space S is disposed at a position above the medium flow port 15 (on the side of the upper end surface 14b) on the inner peripheral surface 14a of the tubular member 14. The level sensor 17 outputs a detection signal indicating a detection result to the computer 7. Control of the amount of the medium M in the holding space S at the time of adjusting the focal position of the ultrasonic waves W is performed on the basis of a detection signal from the level sensor 17. A distance sensor for detecting a distance to the semiconductor device D may be mounted on the tubular member 14. Accordingly, interference between the tubular member 14 and the semiconductor device D can be prevented when the stage 3 described later is driven in a Z-axis direction.

As shown in FIG. 1, the stage 3 is a device for moving a position of the semiconductor device D relative to the ultrasonic transducer 2. In the embodiment, the stage 3 is configured as a three-axis stage which can be driven in X, Y, and Z-axis directions, and the ultrasonic transducer 2 is fixed on the stage 3. The driving of the stage 3 is controlled on the basis of an instruction signal from the computer 7. An input position of the ultrasonic waves W on the inspection surface Dt of the semiconductor device D is irradiated by driving the stage 3 in an in-plane direction (the X and Y axis directions) of the inspection surface Dt of the semiconductor device D.

Figure 3:
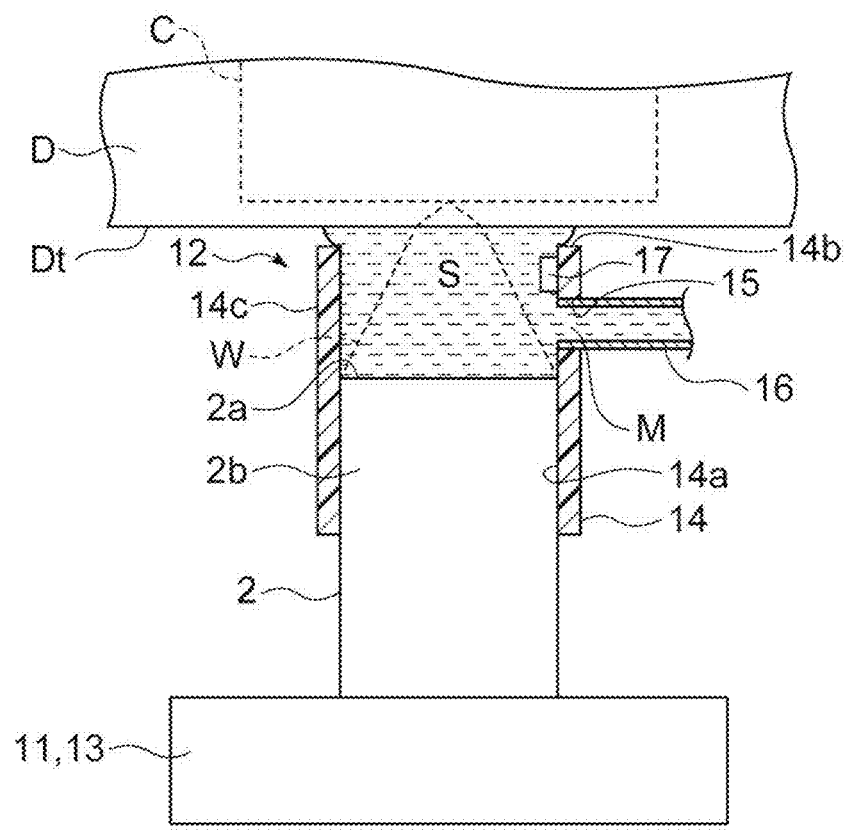
FIG. 3 is a schematic diagram showing a focal position of ultrasonic waves at the time of inspection execution.

Further, the focal position of the ultrasonic waves W is adjusted with a certain accuracy in a thickness direction of the semiconductor device D by driving the stage 3 in the thickness direction (the Z-axis direction) of the semiconductor device D. The stage 3 may be fixed to the semiconductor device D instead of the ultrasonic transducer 2. When the inspection of the semiconductor device D starts, as shown in FIG. 2, the medium M is supplied into the holding space S to such an extent that the medium M rises from the holding space S of the medium holding unit 12 due to surface tension. Additionally, a raised portion Ma of the medium M is brought into contact with the inspection surface Dt of the semiconductor device D by driving the stage 3 in the thickness direction of the semiconductor device D. Therefore, a path of the ultrasonic waves W from the tip end surface 2a of the ultrasonic transducer 2 to the inspection surface Dt of the semiconductor device D is filled with the medium M. Additionally, as shown in FIG. 3, the stage 3 is driven further in the thickness direction of the semiconductor device D, and the focal position of the ultrasonic waves W is adjusted to be in the vicinity of a chip C in the semiconductor device D.

The pulse generator 4 is a device which inputs a driving signal to the ultrasonic transducer 2. A frequency of the driving signal is set to the same frequency as that of the ultrasonic waves W generated by the ultrasonic transducer 2. As in the embodiment, when a lock-in detection is performed using the lock-in amplifier 6, a lock-in frequency may be separately set, and a burst signal obtained by combining a frequency for generating the ultrasonic waves W and the lock-in frequency may be input to the ultrasonic transducer 2 as the driving signal. In this case, a reference signal corresponding to the lock-in frequency is output from the pulse generator 4 to the lock-in amplifier 6. The frequency for generating the ultrasonic waves is, for example, about 25 MHz to 300 MHz, and the lock-in frequency is, for example, about 1 kHz to 5 kHz.

The reaction detection unit 5 is a device which detects a reaction of the semiconductor device D in accordance with the input of the ultrasonic waves W by the ultrasonic transducer 2. The reaction detection unit 5 is configured by, for example, a detection amplifier connected to a front stage of the lock-in amplifier 6. A power supply device 10 which applies a constant voltage or a constant current to the semiconductor device D is built into the reaction detection unit 5. The reaction detection unit 5 detects a current or a voltage of the semiconductor device D corresponding to the input of the ultrasonic waves W and outputs a detection signal indicating a detection result to the lock-in amplifier 6 in a state in which the constant voltage or the constant current is applied. The reaction detection unit 5 may extract only an AC component and may output the detection signal.

The lock-in amplifier 6 is a device which performs a lock-in detection of the detection signal output from the reaction detection unit 5. The lock-in amplifier 6 performs the lock-in detection of the detection signal output from the reaction detection unit 5 on the basis of the reference signal output from the pulse generator 4. Additionally, the lock-in amplifier 6 outputs a detection signal indicating the detection result to the computer 7.

The computer 7 is physically configured by a memory such as a RAM and a ROM, a processor (an arithmetic circuit) such as a CPU, a communication interface, a storage unit such as a hard disk, and a display unit such as a monitor 8. Examples of the computer 7 include a personal computer, a cloud server, a smart device (such as a smartphone, a tablet terminal and the like), a microcomputer, a field-programmable gate array (FPGA), and the like. The computer 7 serves as a stage control unit 21 which controls an operation of the stage 3 and an analysis unit 22 which analyzes the detection signal from the lock-in amplifier 6 by executing a program stored in a memory with a CPU of a computer system.

More specifically, the stage control unit 21 performs control of adjustment of the focal position of the ultrasonic waves W in the thickness direction of the semiconductor device D and control of radiation of the ultrasonic waves W with respect to the inspection surface Dt of the semiconductor device D. In the control of adjustment of the focal position, the stage control unit 21 performs control of the stage 3 with respect to the Z direction on the basis of the detection signal output from the receiver 13 of the ultrasonic transducer 2. In the control of radiation of the ultrasonic waves W, the stage control unit 21 performs control of the stage 3 in the X and Y directions so that the ultrasonic waves W move along the inspection surface Dt of the semiconductor device D. The stage control unit 21 sequentially outputs position information of the stage 3 during the control of radiation to the analysis unit 22.

Figure 4:
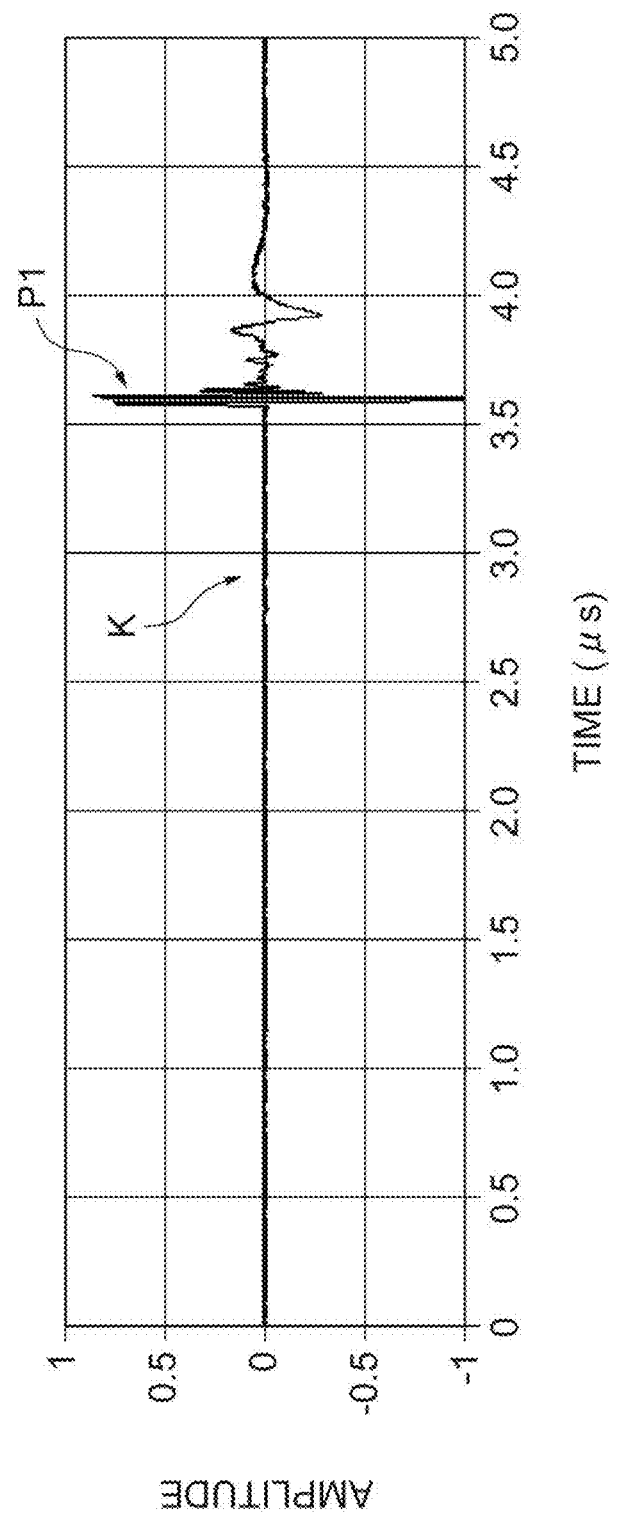
FIG. 4 is a diagram showing an example of control of adjustment of the focal position of the ultrasonic waves.

FIG. 4 is a diagram showing an example of the control of adjustment of the focal position. In the example of the drawing, a horizontal axis represents a time (a time from the output of the ultrasonic waves W to the detection of the reflected waves), a vertical axis represents an amplitude, and a time waveform K of the detection signal from the receiver 13 is plotted. The time waveform K may be obtained by integrating the detection signals of the reflected waves when the ultrasonic waves W are output a plurality of times.

Figure 5:
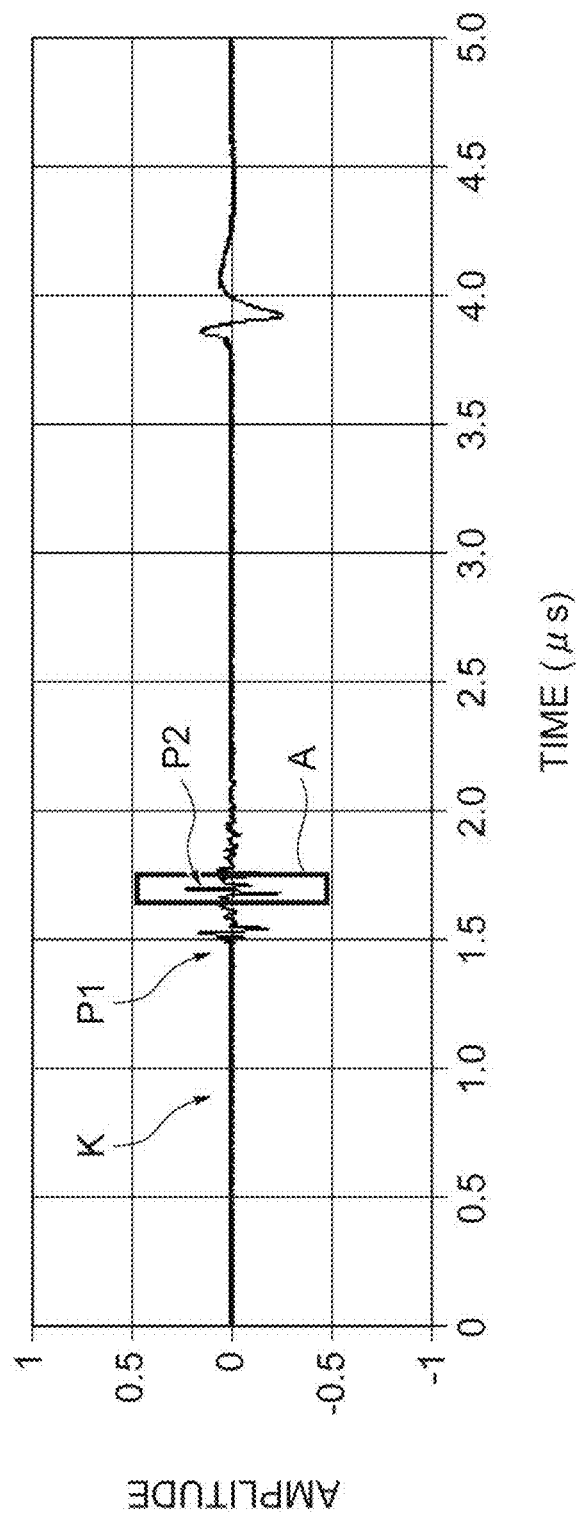
FIG. 5 is a diagram showing a process subsequent to that of FIG. 3.

As shown in FIG. 4, as the focal position of the ultrasonic waves W is displaced toward the semiconductor device D, a first peak P1 corresponding to reflection on a package surface of the semiconductor device D appears at a certain position in the time waveform K. When the focal position of the ultrasonic waves W is further displaced toward the semiconductor device D from the position at which the first peak P1 appears, the focal position of the ultrasonic waves W moves into the package of the semiconductor device D, and a second peak P2 corresponding to reflection on a surface of the chip C inside the semiconductor device D appears at a certain position in the time waveform K, as shown in FIG. 5. Therefore, the stage control unit 21 controls the position of the stage 3 in the Z-axis direction so that an amplitude of the second peak P 2 is maximized.

In the control of adjustment of the focal position, a case in which a resin thickness of the package is known or a case in which a resin composition of the package is known and a speed of sound of the ultrasonic waves W in the package can be calculated is considered. In this case, a range of an appearance position (an appearance time) of the second peak P2 may be calculated in advance on the basis of such information, and a detection window A for detecting the second peak P2 may be set. The detection accuracy of the appearance position of the second peak P2 can be improved and the detection time can be shortened due to the setting of the detection window A. When it is known that a plurality of layers of the chip C are built into the semiconductor device D, the position of the stage 3 in the Z-axis direction may be controlled on the basis of a peak after the second peak P2.

Figure 6:
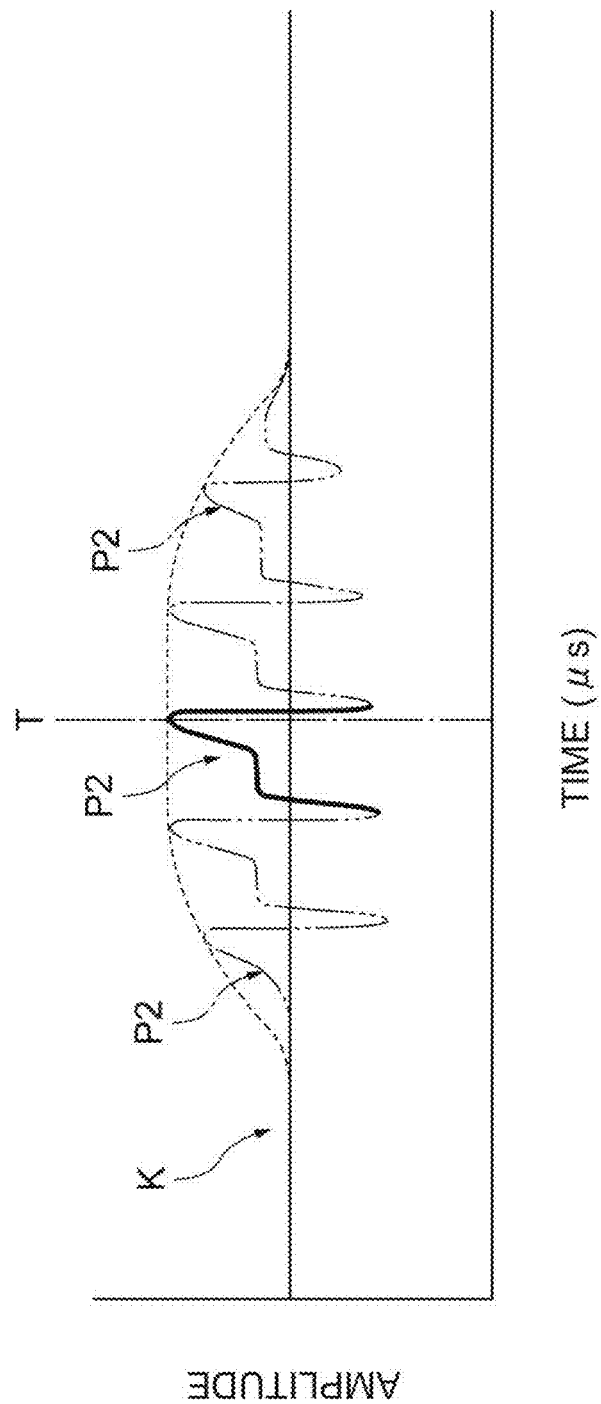
FIG. 6 is a diagram showing another example of adjustment of the focal position of the ultrasonic waves.

Further, since a focal depth of the ultrasonic waves W is relatively deep, it may be difficult to distinguish a position at which the amplitude of the second peak P2 is a maximum. In this case, for example, as shown in FIG. 6, the position of the stage 3 in the Z-axis direction may be adjusted to correspond to a central position (a central time) T in a range in which the amplitude of the second peak P2 is a maximum. Also, the time waveform K may be differentiated, and the position of the stage 3 in the Z-axis direction may be adjusted to correspond to a central position of a peak value of the time waveform after the differential processing.

Figure 7:
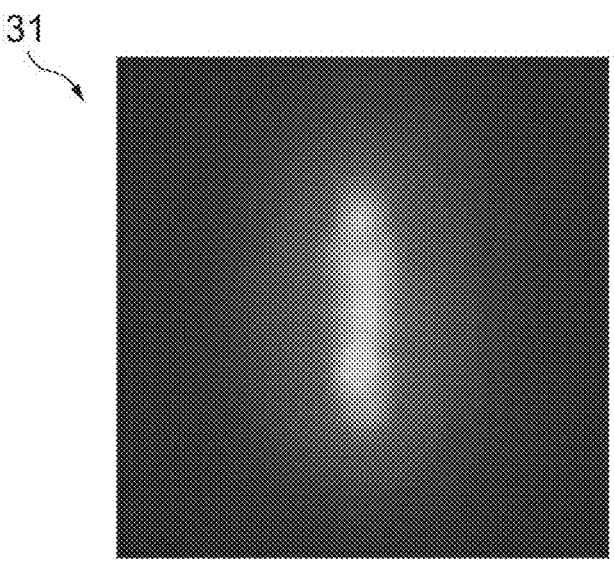
FIG. 7 is a diagram showing an example of an analysis image.

The analysis unit 22 performs mapping of the detection signal output from the lock-in amplifier 6 during the inspection of the semiconductor device D on the basis of the position information of the stage 3 output from the stage control unit 21 and generates an analysis image 31, as shown in FIG. 7. In the analysis image, a display luminance range, a color, a transparency, and the like according to the reaction (an amount of change of a current or a voltage) of the semiconductor device D can be arbitrarily set.

Figure 8:
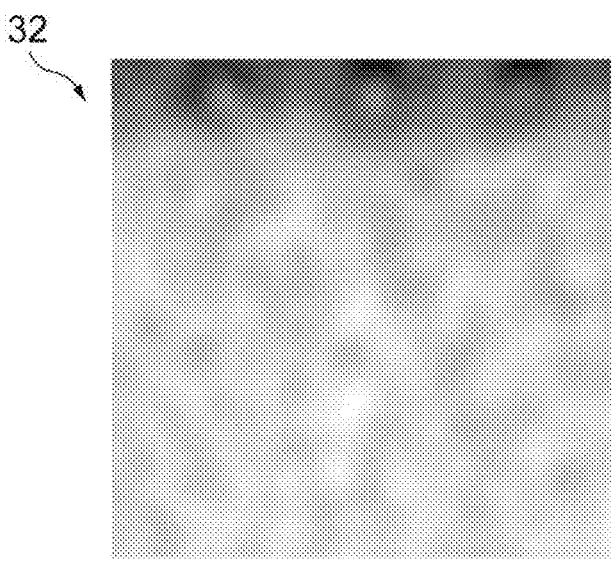
FIG. 8 is a diagram showing an example of a reflection image.

Further, the analysis unit 22 performs mapping of the detection signal output from the receiver 13 during the inspection of the semiconductor device D on the basis of the position information of the stage 3 output from the stage control unit 21 and generates a reflection image 32, as shown in FIG. 8. In generating the reflection image 32, it is preferable to extract only a time component, which corresponds to the reflected wave from the surface of the chip C inside the semiconductor device D, in the detection signal from the receiver 13. In this way, it is possible to obtain the reflection image 32 indicating a shape of the chip C in the semiconductor device D.

Figure 9:
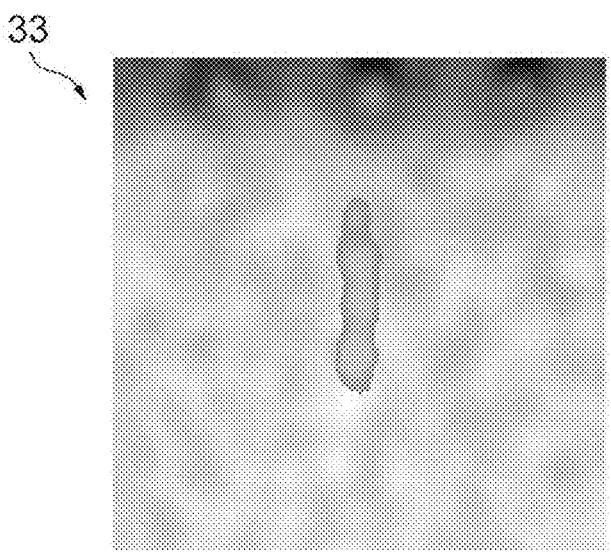
FIG. 9 is a diagram showing an example of a superimposed image.

As shown in FIG. 9, the analysis unit 22 may generate a superimposed image 33 in which the analysis image 31 and the reflection image 32 are superimposed. The analysis unit 22 outputs the generated superimposed image 33 to the monitor 8. In the superimposed image 33, the reaction of the semiconductor device D indicated by the analysis image 31 is superimposed on the shape of the chip C in the semiconductor device D indicated by the reflection image 32, and a position of a fault in the chip C can be easily identified. In the reflection image 32, not only the shape of the chip C but also an abnormality such as separation of a circuit may be checked. Therefore, in the superimposed image 33, when an abnormal position which can be checked from the analysis image 31 and an abnormal position which can be checked from the reflection image 32 are superimposed, the abnormal position may be highlighted and displayed.

Next, an operation of the ultrasonic inspection device 1 will be described.

Figure 10:
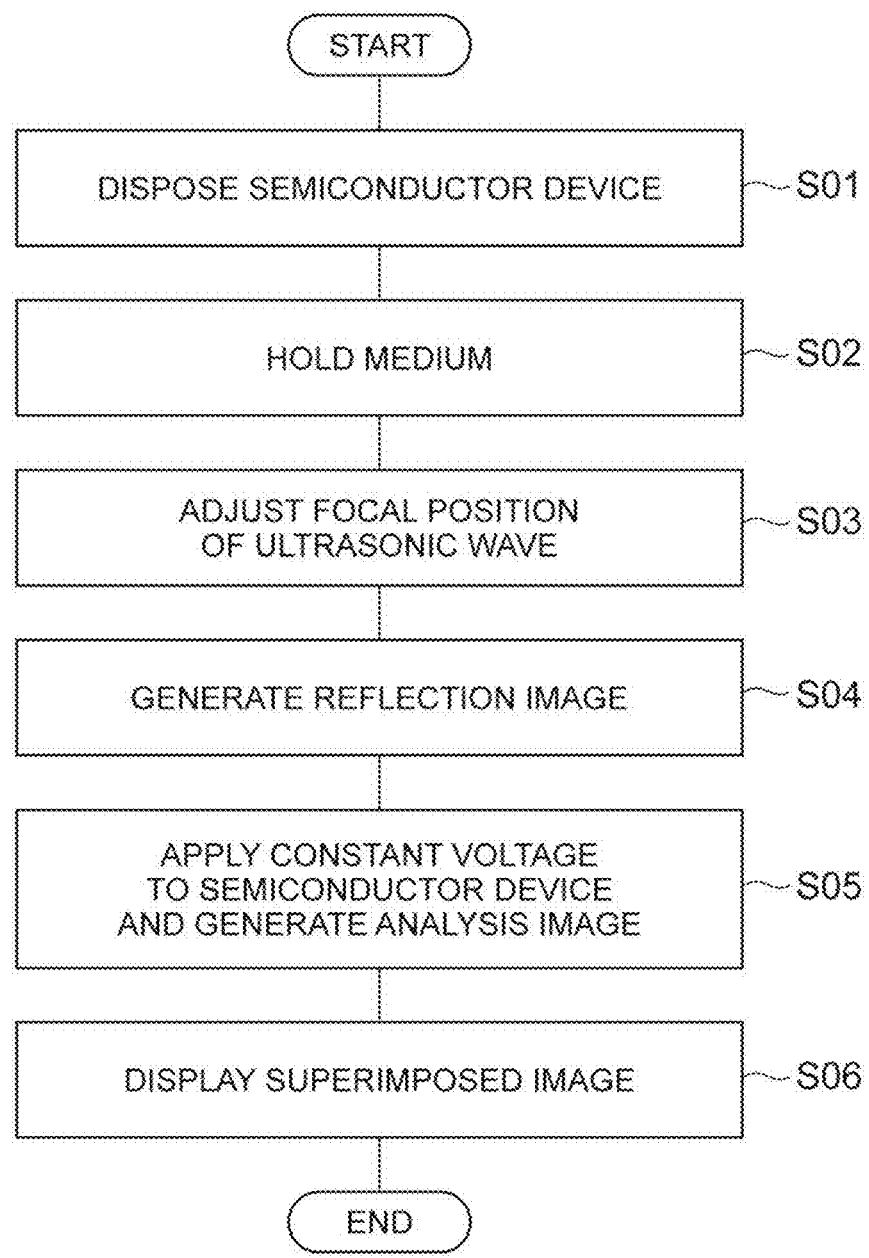
FIG. 10 is a flowchart showing an example of an operation in the ultrasonic inspection device shown in FIG. 1.

FIG. 10 is a flowchart showing an example of the operation of the ultrasonic inspection device 1. As shown in the drawing, when the semiconductor device D is inspected using the ultrasonic inspection device 1, first, the semiconductor device D is disposed on a holding plate (not shown) or the like (Step S01). Next, the medium M is caused to flow from the medium flow port 15 to the medium holding unit 12, and the medium M is held in the holding space S (Step S02). In Step S02, as described above, the raised portion Ma of the medium M due to surface tension is formed. The stage 3 is driven in the Z-axis direction so that the tip end surface 14b of the tubular member 14 does not come into contact with the inspection surface Dt of the semiconductor device D and only the raised portion Ma of the medium M comes into contact with the inspection surface Dt of the semiconductor device D (refer to FIG. 2).

After the medium M is held, the focal position of the ultrasonic waves W is adjusted (Step S03). Here, first, the stage 3 is driven in the X-axis direction and the Y-axis direction so that the ultrasonic transducer 2 comes to a position facing the chip C. Next, on the basis of the appearance position of the second peak P2 in the time waveform K of the reflected waves of the ultrasonic waves W output from the receiver 13, the stage 3 is driven in the Z-axis direction so that the focal position of the ultrasonic waves W coincides with the surface of the chip C inside the semiconductor device D (refer to FIG. 3). The adjustment of the focal position of the ultrasonic waves W may be automatically performed by the stage control unit 21 and may be performed by a user of the ultrasonic inspection device 1 manually moving the position of the stage 3 while visually checking the appearance position of the second peak P2 in the time waveform K.

After the focal position of the ultrasonic waves W is adjusted, a step of adjusting a tilt of the semiconductor device D may be performed. In this step, a posture of the holding plate or the stage 3 is adjusted so that the time waveforms K of the reflected waves when the stage 3 is driven uniaxially in the X-axis direction and the Y-axis direction coincide with each other. This step may also be automatically performed by the stage control unit 21 and may be performed manually while the user of the ultrasonic inspection device 1 visually checks the time waveforms K.

Next, the reflection image of the semiconductor device D is generated (Step S04). In Step S04, the driving signal is input from the pulse generator 4 to the ultrasonic transducer 2, and ultrasonic waves W are radiated from the ultrasonic transducer 2 on the semiconductor device D. Additionally, the reflected waves from the semiconductor device D are detected by the receiver 13, and the reflection image 32 is generated by performing mapping on the basis of the detection signal output from the receiver 13 and the position information of the stage 3 output from the stage control unit 21.

Next, the analysis position is checked based on the reflection image 32, the analysis of the semiconductor device D is performed, and the analysis image is generated (Step S05). In Step S05, a constant voltage (or a constant current) is applied from the power supply device 10 to the semiconductor device D, the driving signal is input from the pulse generator 4 to the ultrasonic transducer 2, and the ultrasonic waves W are input from the ultrasonic transducer 2 to the semiconductor device D. Additionally, the stage 3 is driven in the X and Y-axis directions, and a change in a current or a voltage of the semiconductor device D in accordance with the input of the ultrasonic waves W is detected at each position on the inspection surface Dt of the semiconductor device D. The change in the current or the voltage of the semiconductor device D is detected by the reaction detection unit 5, and the detection signal from which the AC component is extracted is output from the reaction detection unit 5 to the lock-in amplifier 6. In the lock-in amplifier 6, the lock-in detection is performed based on the detection signal output from the reaction detection unit 5 and the reference signal output from the pulse generator 4, and the detection signal thereof is output to the analysis unit 22.

In the analysis unit 22, the analysis image is generated on the basis of the detection signal of the lock-in detection. That is, during the inspection of the semiconductor device D, the mapping of the detection signal output from the lock-in amplifier 6 is performed on the basis of the position information of the stage 3 output from the stage control unit 21, and the analysis image 31 is generated. Additionally, the analysis unit 22 generates the superimposed image 33 in which the analysis image 31 and the reflection image 32 are superimposed, and the superimposed image 33 is displayed on the monitor 8 (Step S06).

As described above, in the ultrasonic inspection device 1, an interval between the ultrasonic transducer 2 and the semiconductor device D can be adjusted in accordance with the position of the medium holding unit 12 provided at the end 2b of the ultrasonic transducer 2 in a state in which the medium M for propagating the ultrasonic waves W is held between the ultrasonic transducer 2 and the semiconductor device D. Therefore, a focal point of the ultrasonic waves W can be easily adjusted to a desired position in the packaged semiconductor device D.

In the ultrasonic inspection device 1, the medium holding unit 12 is configured by the tubular member 14 detachably fitted to the end 2b of the ultrasonic transducer 2. Therefore, the holding space S of the medium M can be formed by the inner peripheral surface 14a of the tubular member 14 and the tip end surface 2a of the ultrasonic transducer 2. Further, the interval between the ultrasonic transducer 2 and the semiconductor device D can be easily adjusted by adjusting a fitting position of the tubular member 14 at the end 2b of the ultrasonic transducer 2. Furthermore, the medium flow port 15 for adjusting the holding amount of the medium M and the level sensor 17 for detecting the holding amount of the medium M are provided at the medium holding unit 12. Thus, the control of the holding amount of the medium M held by the medium holding unit 12 can be easily performed.

Further, in the ultrasonic inspection device 1, the power supply device 10 which applies a constant voltage or a constant current to the semiconductor device D, and the reaction detection unit 5 which detects a current or a voltage of the semiconductor device D corresponding to the input of the ultrasonic waves W in the state in which the constant voltage or the constant current is applied are further provided, and the analysis unit 22 generates the analysis image 31 on the basis of the detection signal from the reaction detection unit 5. In this way, the inspection of the packaged semiconductor device D can be performed with high accuracy by measuring change in resistance in the semiconductor device D caused by the input of the ultrasonic waves W.

Further, in the ultrasonic inspection device 1, the pulse generator 4 which inputs the driving signal to the ultrasonic transducer 2 and outputs the reference signal corresponding to the driving signal is further provided, and the analysis unit 22 generates the analysis image 31 on the basis of the detection signal and the reference signal. The inspection accuracy of the packaged semiconductor device D can be further enhanced by performing the lock-in detection based on the reference signal.

Further, in the ultrasonic inspection device 1, the receiver 13 which detects the reflected waves of the ultrasonic waves W reflected by the semiconductor device D is further provided, and the analysis unit 22 generates the reflection image 32 on the basis of the detection signal from the reaction detection unit 5. In this case, the shape of the chip C in the semiconductor device D can be acquired on the basis of the reflection image 32. Furthermore, it is also possible to detect physical abnormalities such as separation of a circuit.

Further, in the ultrasonic inspection device 1, the analysis unit 22 generates the superimposed image 33 in which the analysis image 31 and the reflection image 32 are superimposed. In the superimposed image 33, since the analysis result from the analysis image 31 and the shape of the chip C in the semiconductor device D are superimposed, it is easy to identify a position of a fault and the like.

The present invention is not limited to the above-described embodiment. In the above-described embodiment, the medium holding unit 12 is applied to the ultrasonic transducer 2 in a device which analyzes the reaction of the semiconductor device D according to the input of the ultrasonic waves W, but the configuration of the medium holding unit 12 may be applied to a device which analyzes the reaction of the semiconductor device by another method. For example, the medium holding unit 12 may be applied to a, device in which a test pattern from a tester is input and the reaction of the semiconductor device is analyzed.

REFERENCE SIGNS LIST

1 Ultrasonic inspection device
2 Ultrasonic transducer
2b End
3 Stage
4 Pulse generator (signal generation unit)
5 Reaction detection unit
10 Power supply device
12 Medium holding unit
13 Receiver (reflection detection unit)
14 Tubular member 15 Medium flow port
17 Level sensor (holding amount detection unit)
22 Analysis unit
31 Analysis image
32 Reflection image
33 Superimposed image
C Chip
D Semiconductor device
M medium
W Ultrasonic wave

The invention claimed is:

1. An ultrasonic inspection device for inspection of a packaged semiconductor device, comprising:
    an ultrasonic transducer disposed to face the semiconductor device;
    a medium holder configured to be provided at an end of the ultrasonic transducer facing the semiconductor device and hold a medium through which ultrasonic waves are propagated;
    a stage configured to move the ultrasonic transducer and cause a position of the semiconductor device to shift relative to the ultrasonic transducer; and
    an analyzer configured to analyze a reaction of the semiconductor device in accordance with an input of the ultrasonic waves from the ultrasonic transducer.

2. The ultrasonic inspection device according to claim 1, wherein the medium holder is configured by a tubular member provided at the end of the ultrasonic transducer.

3. The ultrasonic inspection device according to claim 1, wherein the medium holder is slidably fitted to the end of the ultrasonic transducer.

4. The ultrasonic inspection device according to claim 1, wherein the medium holder has a medium flow port configured to adjust a holding amount of the medium.

5. The ultrasonic inspection device according to claim 1, wherein the medium holder has a holding amount detection unit configured to detect a holding amount of the medium.

6. The ultrasonic inspection device according to claim 1, further comprising:
    a power supplier configured to apply a constant voltage or a constant current to the semiconductor device, and
    a reaction detector configured to detect a current or a voltage of the semiconductor device in accordance with input of the ultrasonic waves in a state in which the constant voltage or the constant current is applied,
    wherein the analyzer generates an analysis image on the basis of a detection signal from the reaction detector.

7. The ultrasonic inspection device according to claim 6, further comprising a signal generation unit configured to input a driving signal to the ultrasonic transducer and output a reference signal corresponding to the driving signal,
    wherein the analyzer generates the analysis image on the basis of the detection signal and the reference signal.

8. The ultrasonic inspection device according to claim 6, further comprising a reflection detection unit configured to detect reflected waves of the ultrasonic waves reflected by the semiconductor device,
    wherein the analyzer generates a reflection image on the basis of a detection signal from the reflection detection unit.

9. The ultrasonic inspection device according to claim 8, wherein the analyzer generates a superimposed image in which the analysis image and the reflection image are superimposed.

* * * * *